United States Patent
Haddy

(10) Patent No.: US 9,086,441 B2
(45) Date of Patent: Jul. 21, 2015

(54) DETECTION OF BURIED ASSETS USING CURRENT LOCATION AND KNOWN BUFFER ZONES

(71) Applicant: Alan Haddy, Naples, FL (US)

(72) Inventor: Alan Haddy, Naples, FL (US)

(73) Assignee: IPEG Corporation, Naples, FL (US)

( * ) Notice: Subject to any disclaimer, the term of this patent is extended or adjusted under 35 U.S.C. 154(b) by 0 days.

(21) Appl. No.: 14/572,329

(22) Filed: Dec. 16, 2014

(65) Prior Publication Data

US 2015/0097568 A1    Apr. 9, 2015

Related U.S. Application Data

(63) Continuation-in-part of application No. 14/519,910, filed on Oct. 21, 2014, which is a continuation-in-part of application No. 14/226,397, filed on Mar. 26, 2014, now Pat. No. 8,872,626, which is a continuation-in-part of application No. 14/060,301, filed on Oct. 22, 2013, now Pat. No. 8,823,492, which is a continuation-in-part of application No. 13/745,846, filed on Jan. 20, 2013, which is a continuation-in-part of application No. 13/543,612, filed on Jul. 6, 2012, now Pat. No. 8,358,201.

(51) Int. Cl.
| | |
|---|---|
| *G01V 3/08* | (2006.01) |
| *G01R 31/02* | (2006.01) |
| *G01V 3/12* | (2006.01) |
| *G08C 17/02* | (2006.01) |
| *G01V 3/15* | (2006.01) |

(52) U.S. Cl.
CPC ............... *G01R 31/023* (2013.01); *G01V 3/12* (2013.01); *G08C 17/02* (2013.01); *G01V 3/15* (2013.01)

(58) Field of Classification Search
CPC ......... G01R 31/023; G01V 3/12; G01V 3/15; G01V 3/08; G08C 17/02
USPC .................. 324/326–329; 702/1, 2, 8; 340/8.1
See application file for complete search history.

(56) References Cited

U.S. PATENT DOCUMENTS

| | | | |
|---|---|---|---|
| 3,192,747 | A | 7/1965 | Etal |
| 7,311,526 | B2 | 12/2007 | Rohrbach |
| 7,517,222 | B2 | 4/2009 | Rohrbach |
| 8,435,042 | B2 | 5/2013 | Rohrbach |
| 8,612,271 | B2 | 12/2013 | Nielsen |
| 2009/0121933 | A1 | 5/2009 | Tucker |
| 2009/0167308 | A1 | 7/2009 | Lomes |
| 2010/0045517 | A1 | 2/2010 | Tucker |
| 2010/0188245 | A1 * | 7/2010 | Nielsen et al. ............. 340/686.1 |
| 2010/0211354 | A1 | 8/2010 | Park |
| 2013/0065406 | A1 | 3/2013 | Rohrbach |

* cited by examiner

*Primary Examiner* — Jay Patidar
(74) *Attorney, Agent, or Firm* — Mark Terry

(57) ABSTRACT

A method on a mobile computing device for locating electromagnetic signals radiating from a buried asset is disclosed. The method includes receiving buried asset data points corresponding to a buried asset, reading a predefined value, generating, based on the buried asset data points, a two dimensional area comprising a buffer zone at an above-surface location, wherein a width of the buffer zone corresponds to the predefined value, and wherein the buffer zone corresponds to the buried asset, and iteratively executing the following four steps: a) calculating an above-surface location, b) determining whether the above-surface location is located within the two dimensional area, c) if the above-surface location is not located within the two dimensional area, displaying a first graphic in a display, and d) if the above-surface location is located within the two dimensional area, displaying a second graphic.

7 Claims, 14 Drawing Sheets

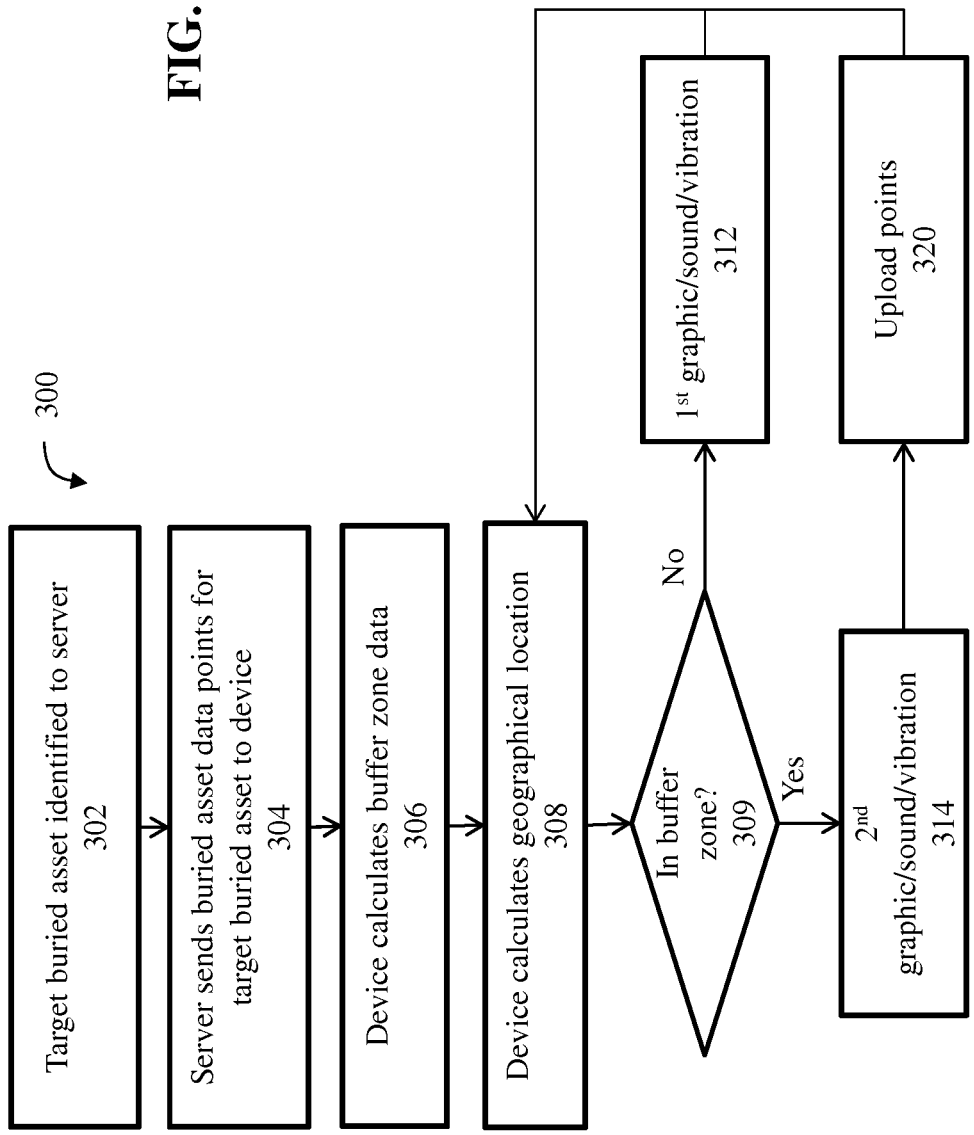

DETECTION OF BURIED ASSETS USING CURRENT LOCATION AND KNOWN BUFFER ZONES

CROSS-REFERENCE TO RELATED APPLICATIONS

This patent application is a continuation in part of, and claims priority to, patent application Ser. No. 14/519,910 filed Oct. 21, 2014 and entitled "Improved Detection of Buried Assets Using Current Location and Known Buffer Zones," which is a continuation in part of, and claims priority to, patent application Ser. No. 14/226,397 filed Mar. 26, 2014 and entitled "Improved Detection of Buried Assets Using Current Location and Known Buffer Zones," which is a continuation in part of, and claims priority to, patent application Ser. No. 14/060,301 filed Oct. 22, 2013 and entitled "Detection of Incursion of Proposed Excavation Zones Into Buried Assets," which is a continuation in part of, and claims priority to, patent application Ser. No. 13/745,846 filed Jan. 20, 2013 and entitled "Storage and Recall of Buried Asset Data Over Communications Networks for Damage Avoidance and Mapping," which is a continuation in part of patent application Ser. No. 13/543,612 filed Jul. 6, 2012 and entitled "Storage and Recall of Buried Asset Data Over Communications Networks for Damage Avoidance and Mapping", now U.S. Pat. No. 8,358,201. The subject matter of patent application Ser. Nos. 14/519,910, 14/226,397, 14/060,301, 13/543,612 and 13/745,846 are hereby incorporated by reference in their entirety.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

TECHNICAL FIELD

The technical field relates generally to the detection and identification of buried assets (i.e., underground utility lines) and, more specifically, to processes for improving the precision of detection of buried assets.

BACKGROUND

Utility lines, such as lines for telephones, electricity distribution, natural gas, cable television, fiber optics, Internet, traffic lights, street lights, storm drains, water mains, and wastewater pipes, are often located underground. Utility lines are referred to as "buried assets" herein. Consequently, before excavation occurs in an area, especially an urban area, an excavator is typically required to clear excavation activities with the proper authorities and service providers. The clearance procedure usually requires that the excavator contact a central authority (such as "One Call", "811" and "Call Before You Dig," which are well known in the art) which, in turn, sends a notification to the appropriate utility companies. Subsequently, each utility company must perform a buried asset detection procedure, which includes having a field technician visit the proposed excavation site, detecting the relevant buried assets and physically marking the position of the buried asset using temporary paint or flags. Usually, a technician visiting a proposed excavation site utilizes a device known as a conventional locator—a commercial, off-the-shelf, utility locator device that detects and identifies buried assets using radio frequency and/or magnetic sensors. Upon completion of this procedure by the appropriate utility companies, excavation can occur with the security that buried assets will not be damaged.

Utility companies are faced with increasing requests to locate and mark the position of their buried assets to avoid damage from third party excavators, contractors and underground horizontal boring operations. One of the main obstacles experienced by locate technicians involves the presence of multiple buried assets in close proximity A single buried asset carrying a suitably impressed signal emanates an electromagnetic field in a standard circular radiating pattern 510 shown in FIG. 5A. Conventional pipe and cable locator devices 530 perform well when encountering a single buried asset radiating the standard circular electromagnetic signal pattern 510 from under the ground 518. When multiple buried assets are present in close proximity, however, interference signals are likely to result like pattern 520 shown in FIG. 5A. Conventional locator devices do not perform well when encountering multiple buried assets emanating the interference signals such as the pattern 520. Interference signals such as shown in 520 require the services of a very experienced and skilled technician to detect such a situation exists and it is very time consuming to make the appropriate adjustments so as not to mis-locate the buried asset the technician is seeking. With experienced technicians in short supply, utility and locator companies do not have the resources to attend to all such situations that are presented. Even for experienced and skilled technicians, finding a target buried asset when interference signals are encountered can be time-consuming or simply not possible, and can lead to errors and mis-locates. As such, this leads to increased costs for utility companies and service providers, as well as potential safety hazards to workers and the general public.

Therefore, a need exists for improvements over the prior art, and more particularly for more efficient methods and systems for detecting and locating multiple buried assets in close proximity

SUMMARY

A method on a mobile computing device communicatively connected to a communications network, the mobile computing device for locating electromagnetic signals radiating from a buried asset is provided. This Summary is provided to introduce a selection of disclosed concepts in a simplified form that are further described below in the Detailed Description including the drawings provided. This Summary is not intended to identify key features or essential features of the claimed subject matter. Nor is this Summary intended to be used to limit the claimed subject matter's scope.

In one embodiment, a method on a mobile computing device for locating electromagnetic signals radiating from a buried asset is provided that solves the above-described problems. The method includes receiving, via a communications network communicatively coupled with the mobile computing device, a group of buried asset data points corresponding to a particular buried asset sought by an operator of the mobile computing device, reading a predefined value pertaining to a width of a buffer zone, generating, based on the group of buried asset data points, a two dimensional area comprising a buffer zone at an above-surface location, wherein a width of the buffer zone corresponds to the predefined value, and wherein the buffer zone corresponds to the particular buried asset, and iteratively executing the following four steps: a) calculating an above-surface location of the mobile computing device, b) determining whether the above-surface location of the mobile computing device is located within the two dimensional area, c) if the above-surface location is not located within the two dimensional area, displaying a first graphic in a display of the mobile computing device, and d) if the above-surface location is located within the two dimensional area, displaying a second graphic in the display.

BRIEF DESCRIPTION OF THE DRAWINGS

The accompanying drawings, which are incorporated in and constitute a part of this disclosure, illustrate various example embodiments. In the drawings:

FIG. 3 is a flow chart showing the control flow of the process for locating a buried asset using geographical location and known buffer zones, according to an example embodiment;

DETAILED DESCRIPTION

Figure 1:
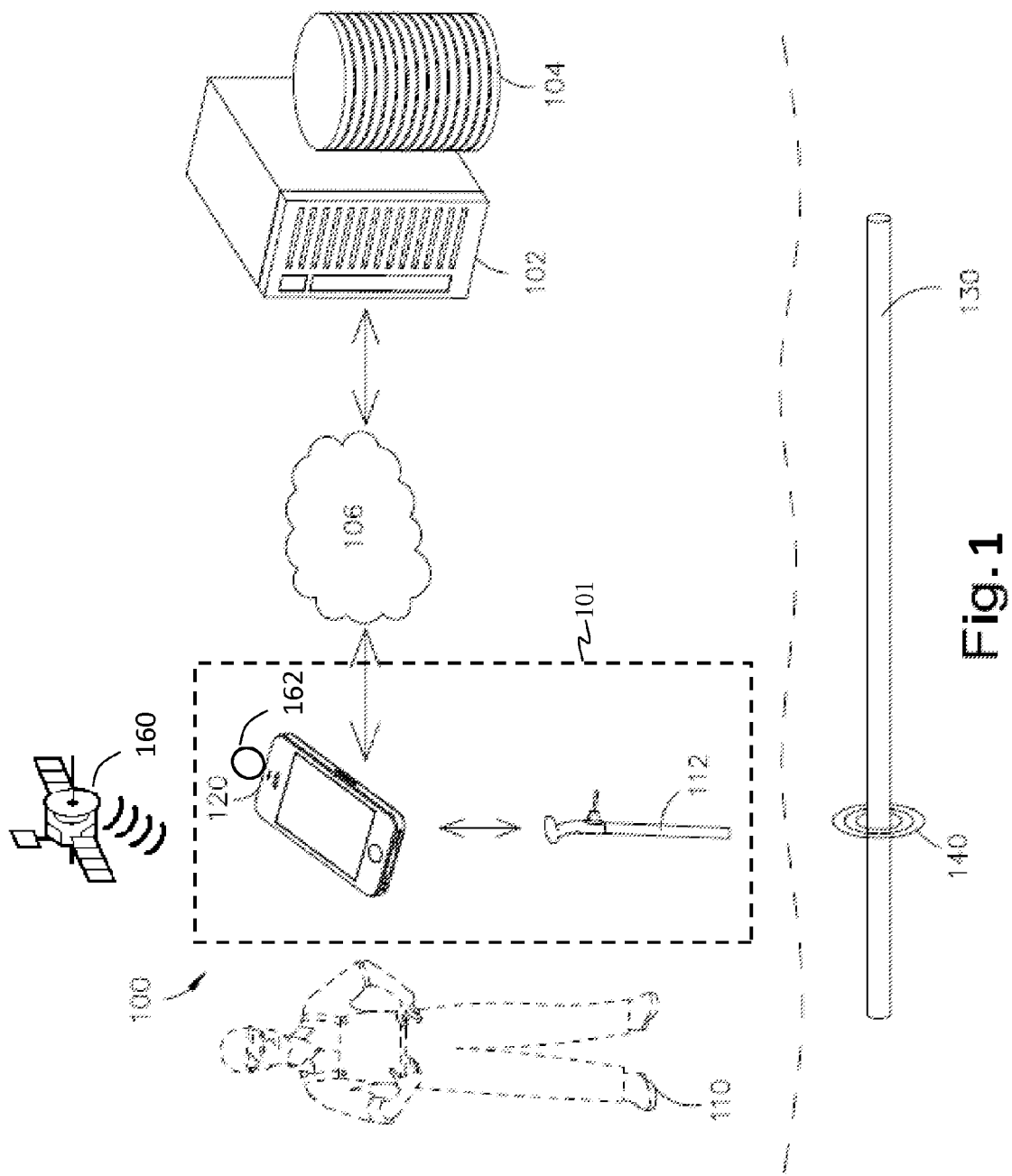
FIG. 1 is a diagram of an operating environment that supports a process for locating a buried asset using geographical location and known buffer zones, according to an example embodiment.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

The present invention improves over the prior art by providing a more efficient, safe and precise way of locating a particular buried asset in situations where multiple buried assets are located in close proximity and emanating interference signals. The example embodiments leverage: 1) the wide availability of geographical location processors (such as GPS processors and other satellite or ground-based navigation systems) that provide geographical location information, as well as 2) previously stored buried asset data points used to generate buffer zones around a target buried asset, so as to provide an appropriate indicator to the technician, according to the device's geographical location. By alerting the technician when the locate technician is located within and without the buffer zone of the target buried asset, or by only allowing the locating functions of a pipe or locator device to be enabled when the locate technician is located within and without the buffer zone of the target buried asset, the example embodiments reduce or eliminate the possibility that the locate technician may accidentally misidentify interference signal readings from another buried asset as the target buried asset. This feature results in more safe, precise and accurate results by the field technician. The example embodiments further reduce the number of false identifications of a buried asset's location. This decreases the costs associated with buried asset detection in relation to the central authority.

FIG. 1 is a diagram of an operating environment 100 that supports a process on a server 102 for locating a target buried asset using geographical location information and known buffer zone information. The server 102 may be communicatively coupled with a communications network 106, according to an example embodiment. The environment 100 may comprise a mobile computing device 120, which may communicate with server 102 via a communications network 106. Mobile computing device 120 may comprise a cellular telephone, smart phone or tablet computer. Device 120 may also comprise other computing devices such as desktop computers, laptops, and game consoles, for example. The mobile computing device 120 may be connected either wirelessly or in a wired or fiber optic form to the communications network 106. Communications network 106 may be a packet switched network, such as the Internet, or any local area network, wide area network, enterprise private network, cellular network, phone network, mobile communications network, or any combination of the above.

The environment 100 shows that mobile computing device 120 is operated by a technician or operator 110 (i.e., a field technician) and includes an antenna array 112, which may be communicatively coupled, either wirelessly or in a wired or fiber optic form, to the mobile computing device 120. As such, server 102, and devices 120 and 112 may each comprise a computing device 1100, described below in greater detail with respect to FIG. 6. FIG. 1 shows that antenna array 112 may be a component including one or more sensors that detect and measure radio frequency and/or electromagnetic signals 140 emanating from a buried asset 130. In one embodiment, array 112 includes all of the functions of a conventional locator device, which is well known in the art.

In another embodiment, the device 120 also calculates its current geographical position using an on-board processor or a connected processor and transmits it to the server 102 over network 106. In one embodiment, the device 120 calculates its current position using a satellite or ground based positioning system, such as a Global Positioning System (GPS) system, which is a navigation device that receives satellite or land based signals for the purpose of determining the device's current geographical position on Earth. A GPS receiver, and its accompanying processor, may calculate latitude, longitude and altitude information. In this embodiment, a radio frequency signal is received from a satellite (such as 160) or ground based transmitter comprising a time the signal was transmitted and a position of the transmitter. Subsequently, the device 120 calculates current geographical location data of the device 120 based on the signal, and transmits the current geographical location data to the server 102 via the communications network 106. In another embodiment, the device 120 calculates its current geographical location using alternative services, such as control plan locating, GSM localization, dead reckoning, or any combination of the aforementioned position services. The term spatial technologies or spatial processes refers generally to any processes and systems for determining one's position using radio signals received from various sources, including satellite sources, land-based sources and the like. In yet another embodiment, the device 120 also calculates its current compass heading (such as via the use of a compass application) and transmits this data to the server 102 over network 106.

In one embodiment, FIG. 1 shows that device 120 includes a peripheral 162, which may be a high accuracy or high precision satellite or ground based positioning system module that provides positional data of greater accuracy to device 120. In this embodiment, the functions related to calculating current geographical position are performed by device 162 instead of, or in conjunction with, device 120. In addition to satellite(s) 160, peripheral 162 may collect data from other sources, such as land-based position data providers that broadcast position data over radio frequency, or additional constellations of satellites. Alternatively, in lieu of device 120, array 112 and peripheral 162, the technician 110 may utilize a single, integrated locator device that detects and identifies buried assets using radio frequency and/or electromagnetic sensors, and which further performs the functions of device 120, array 112 and peripheral 162, as described herein. In this alternative, all of the functions of 120, 112, and 162 are provided by one, single, integrated device (indicated by 101 in FIG. 1) handled by technician 110.

Server 102 includes a software engine that delivers applications, data, program code and other information to networked device 120. The software engine of server 102 may perform other processes such as transferring multimedia data in a stream of packets that are interpreted and rendered by a software application as the packets arrive. FIG. 1 further shows that server 102 includes a database or repository 104, which may be a relational database comprising a Structured Query Language (SQL) database stored in a SQL server. Mobile computing device 120 may also include its own database, either locally or via the cloud. The database 104 may serve buried asset data, buffer zone data, as well as related information, which may be used by server 102 and mobile computing device 120.

Server 102, mobile computing device 120 and antenna array 112 may each include program logic comprising computer source code, scripting language code or interpreted language code that perform various functions of the present invention. In one embodiment, the aforementioned program logic may comprise program module 607 in FIG. 6. It should be noted that although FIG. 1 shows only one mobile computing device 120 and one server 102, the system of the present invention supports any number of servers and mobile computing devices connected via network 106. Also note that although server 102 is shown as a single and independent entity, in one embodiment, server 102 and its functionality can be realized in a centralized fashion in one computer system or in a distributed fashion wherein different elements are spread across several interconnected computer systems.

Environment 100 may be used when a mobile computing device 120 engages in buried asset detection activities that comprise reading, generating, and storing buried asset data. Various types of data may be stored in the database 104 of server 102 (as well as data storage on device 120) with relation to a buried asset that has been detected and located. For example, the database 104 (or device 120) may store one or more records for each buried asset, and each record may include one or more buried asset data points. A buried asset data point may include a current time, a textual map address, and location data or position data, such as latitude and longitude coordinates, geographical coordinates, an altitude coordinate, or the like. A buried asset data point may also include depth measurement data, electromagnetic signal measurement data (such as electrical current measurement data, resistance measurement data, impedance measurement data, electrical signal magnitude measurement data, electrical signal frequency measurement data, electrical signal voltage measurement data, etc.), direction data and orientation data.

A buried asset data point may also include a precision data value corresponding to any piece of information associated with a buried asset data point, such as the geographical coordinate or. A precision data value is a value that represents the quality or level of precision of a piece of information, such as a geographical coordinate. All sensors and devices that read physical quantities have a certain amount of measurement error or observational error. A precision data value represents the amount or magnitude of the measurement error or observational error of a sensor or device at one time. In one embodiment, a precision data value is a numerical value, such as a real number from 0 to 1.0 (with a variable number of decimal points) wherein zero represents perfect precision, 0.5 represents a precision that is 50% off from a true value, 0.75 represents a precision that is 75% off from a true value, etc. In another embodiment, a precision data value is an alphanumeric value (such as a word or other ASCII string) that corresponds (according to a lookup table or other correspondence table) to a predefined amount of precision. In another embodiment, a precision data value is any set of values that may be sorted according to ascending or descending value. Thus, in this embodiment, precision data values may have ascending and descending values.

In one embodiment, the precision data value is inversely proportional to the level of precision of quality of a piece of information, such as a geographical coordinate. Thus, when there is a large margin of error or a low confidence level in a piece of information, then the precision data value is high and the quality or level of precision of the information is low. Conversely, when there is a small margin of error or a high confidence level in a piece of information, then the precision data value is low and the quality or level of precision of the information is high.

With regard to geographical coordinates, HDOP, VDOP, PDOP, and TDOP values (Horizontal, Vertical, Positional and Time Dilution of Precision, respectively) are precision data values well known in the art for representing the quality or level of precision of a geographical coordinate. Also with regard to geographical coordinates, values representing the quality or level of precision of a geographical coordinate may rely on whether a differential correction technique (such as differential GPS) was used in calculating the coordinate. The Differential Global Positioning System (DGPS) is an enhancement to Global Positioning System that provides improved location accuracy. DGPS uses a network of fixed, ground-based reference stations to broadcast the difference between the positions indicated by the satellite systems and the known fixed positions. As such, if DGPS was used to calculate a geographical coordinate, then the precision data value of the coordinate may reflect that fact. For example, the precision data value may indicate higher accuracy if DGPS was used.

In one embodiment, Precise Point Positioning (PPP) is used to generate a precision data value representing the quality or level of precision of a geographical coordinate. PPP is a global navigation satellite system positioning method to calculate precise positions up to few centimeter level using a single receiver in a dynamic and global reference framework.

The PPP method combines precise clocks and orbits calculated from a global network to calculate a precise position with a single receiver.

A buried asset data point may also include a precision data value corresponding to any piece of information associated with a buried asset data point, such as a current time, a textual map address, depth measurement data, electrical signal measurement data (such as electrical current measurement data, signal strength data, resistance measurement data, impedance measurement data, electrical signal magnitude measurement data, electrical signal frequency measurement data, electrical signal voltage measurement data, electromagnetic vector data, etc.), direction data (left or right indicators that direct the technician to the location of the buried asset), orientation data, and location data or position data, such as latitude and longitude coordinates, geographical coordinates, an altitude coordinate, or the like.

Figure 2:
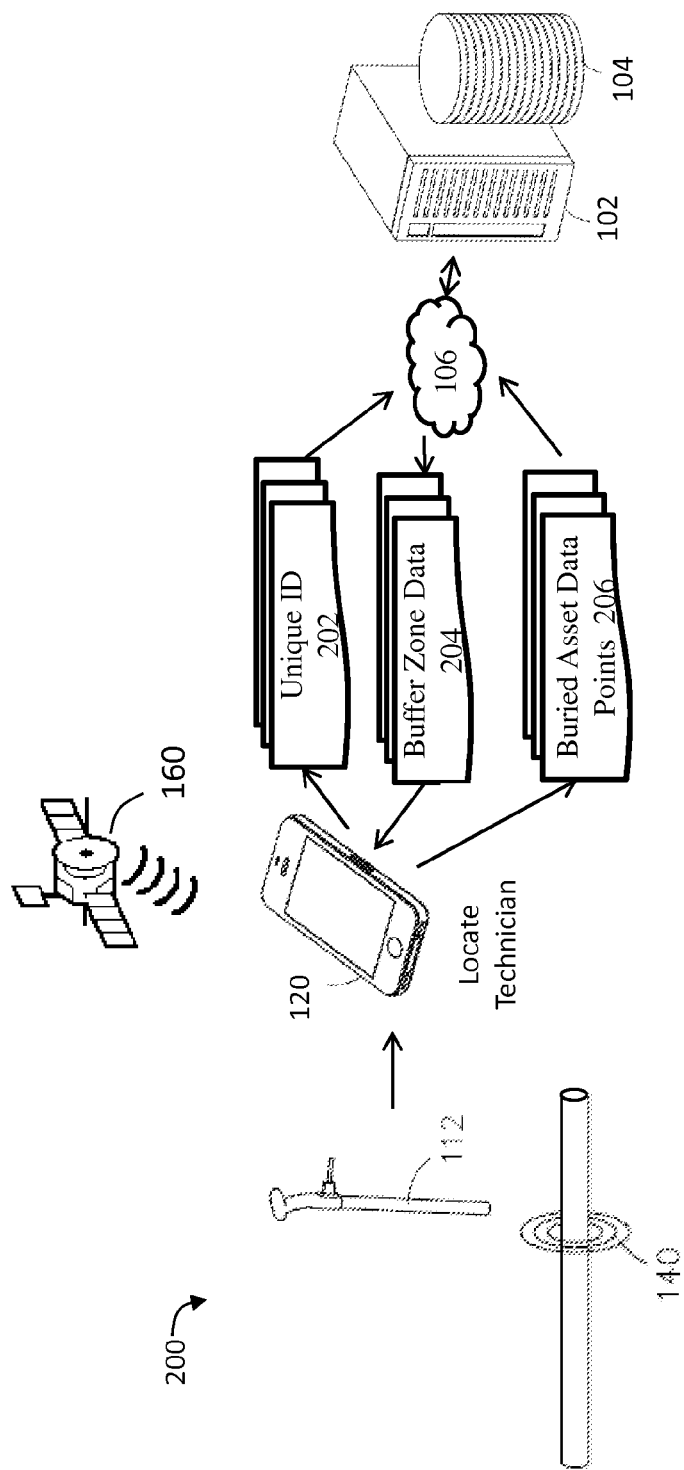
FIG. 2 is a diagram showing the data flow of the general process for locating a buried asset using geographical location and known buffer zones, according to an example embodiment.
Figure 5A:
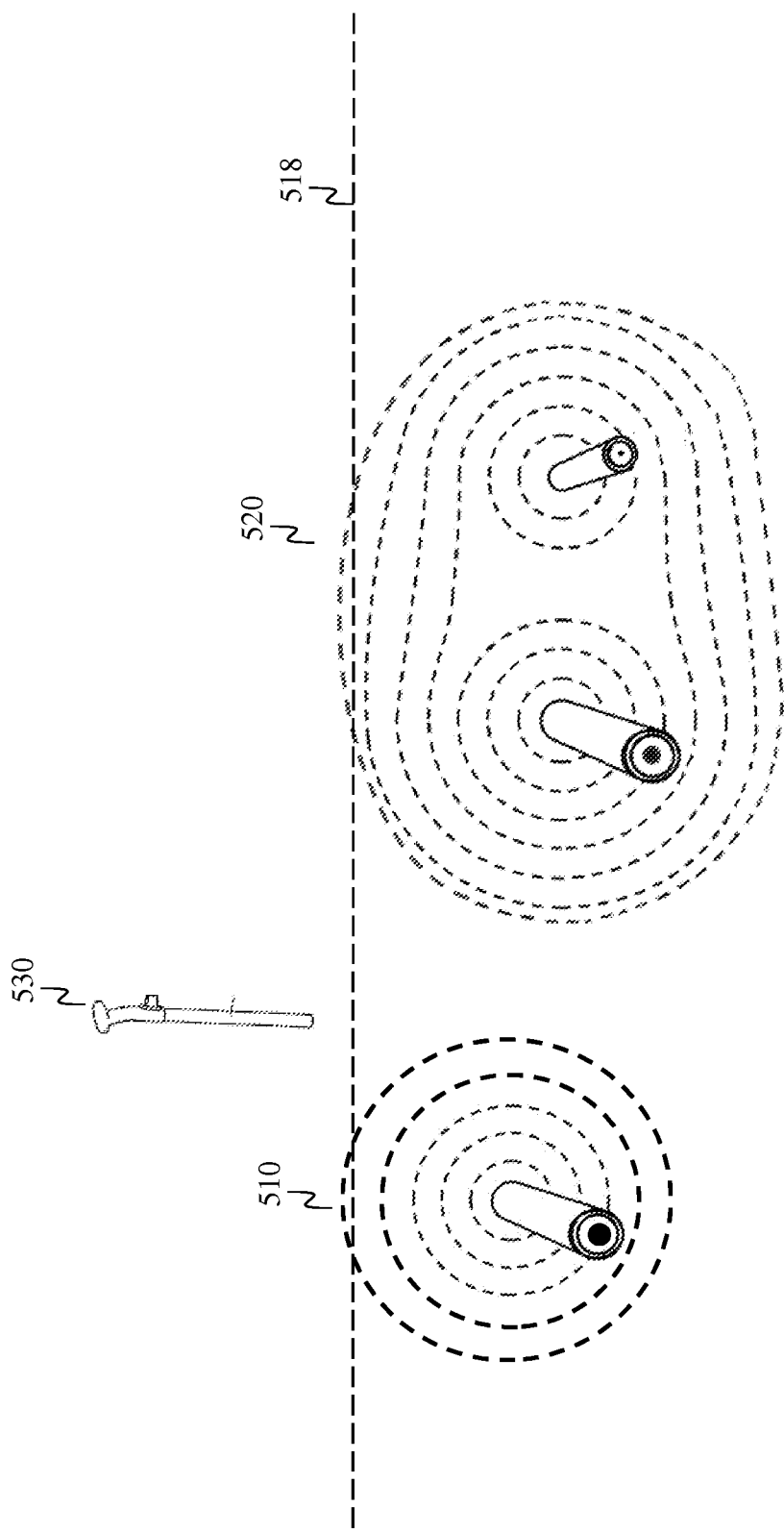
FIG. 5A is an illustration of radio frequency and/or electromagnetic radiating patterns emanating from buried assets.

FIG. 3 is a flow chart showing the control flow of the process 300 for locating a target buried asset using current geographical location information and known buffer zone information, according to an example embodiment. Process 300 describes the steps that occur when the locate technician 110 is seeking a particular target buried asset 552 (see FIG. 5B) that may be located within an area including multiple buried assets, giving rise to a situation where interference signals (such as shown in 520 in FIG. 5A and 520 in FIG. 5B) are present. The process 300 is described with reference to FIG. 1 and FIG. 2, which shows the general data flow 200 of the process 300, and FIG. 5B, which shows the status of the locating functions or graphics/sounds of the device 530 when located inside and outside a buffer zone. Although the process 300 is described with reference to actions performed by device 120, any reference to device 120 may be interchangeable with a reference to device 101, as described above.

Process 300 starts with step 302 wherein a target buried asset 552 (see FIG. 5B), which is the buried asset the technician 110 is seeking, is identified to the server 102. In one embodiment, this step is accomplished by the reception of the server 102 of a work ticket specifying that a locate action must be performed at a particular location for a particular buried asset identified by unique identifier 202, type of buried asset, expected reading for buried asset, or the like. In another embodiment, this step is accomplished by the server 102 receiving a command from the technician 110, wherein the device 120 sends a unique identifier 202 for the target buried asset 552 to the server 102 via network 106. Step 302 may be performed while the technician 110 and device 120 are located on site in the vicinity of the target buried asset 552, while the technician is at work or headquarters, while the technician is at home, on the road, or at any other location. In another embodiment, step 302 may be performed automatically when the technician 110 and device 120 arrive at the vicinity of the target buried asset 552, the device 120 sends its current geographical location to the server 102 and the server 102 determines which buried assets are located at said location.

In step 304, the server 102 accesses a record associated with the unique identifier, wherein the record includes previously recorded buried asset data points for the target buried asset 552. Also in step 304, the server sends to the device 120, via network 106, a data structure 204 including buried asset data points for the target buried asset 552. In another alternative, the device 120 downloads the data structure 204 from a third party via network 106 or reads the data structure 204 from a CD, DVD, thumb drive, another computer or any removable media or computer program product that has been interfaced with the device 120. Like step 302, step 304 may be performed while the technician 110 and device 120 are located on site in the vicinity of the target buried asset 552, while the technician is at work or at headquarters, while the technician is at home, on the road, or at any other location.

In step 306, the device 120 receives and stores the data structure. If the device 120 receives only buried asset data points for the target buried asset 552 from server 102, then device 120 calculates a two-dimensional or three-dimensional buffer zone for the target buried asset 552 based on said buried asset data points. See the description below with reference to FIGS. 4A through 4G for a description of how a two-dimensional or three-dimensional buffer zone for a target buried asset is calculated based on buried asset data points.

Buffer zone data may be stored by device 120 in a variety of ways. For example, a two-dimensional buffer zone may be represented in a data structure as a set of points that define the perimeter of the buffer zone area. In another example, a two-dimensional buffer zone may be represented in a data structure as a set of shapes (such as circles, squares, triangles, rectangles, trapezoids, etc.) that define the buffer zone area, wherein each shape is represented by a set of points that define its perimeter, its vertices, it center, its radius, etc. In another example, a three-dimensional buffer zone may be represented in a data structure as a set of points that define the outside surface of the buffer zone area In one embodiment, steps 304-306 may be performed by device 120 when device 120 interacts with server 102 via network 106 either wirelessly or in a wired manner. In another embodiment, steps 304-306 may be performed by device 120 when device 120 receives buried asset data points from server 102 on a computer program product, such as a removable memory component that contains the data.

In step 308, the device 120, and/or component 162, calculates current geographical information for the device 120/array 112, using methods as disclosed above. In step 309, the device 120 determines whether the current geographical location of the device 120/array 112 is located within the buffer zone 550 (see FIG. 5B). In one alternative to step 309, the device 120 calculates its current geographical information for the device 120/array 112 and transmits said current geographical information to server 102 over network 106. Subsequently, server 102 determines whether the current geographical location of the device 120/array 112 is located within the buffer zone 550.

Figure 5B:
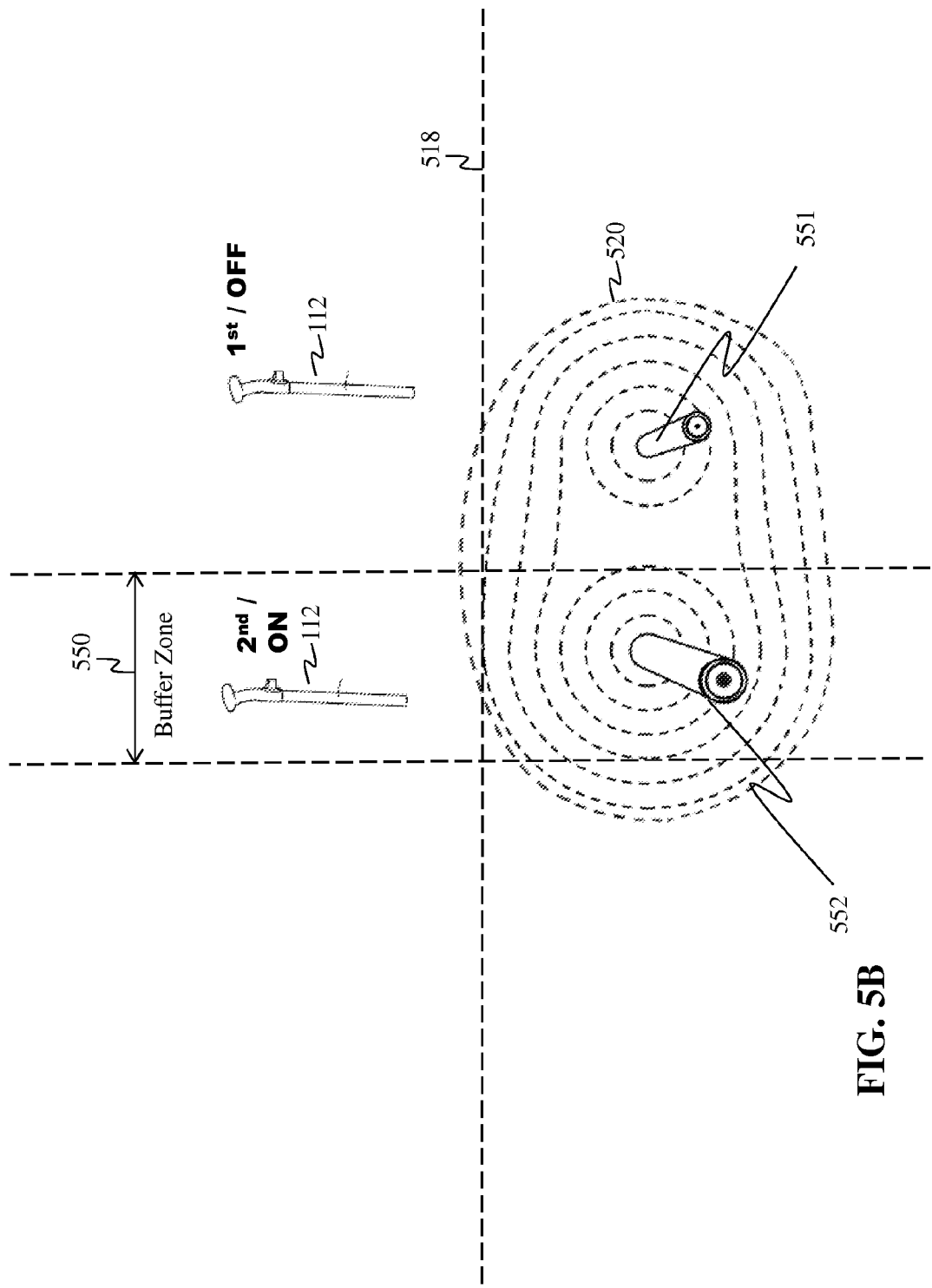
FIG. 5B is an illustration showing the general process for locating a buried asset using geographical location and known buffer zones, according to an example embodiment.

If the current geographical location of device 120/array 112 is not located within the buffer zone 550, then in step 312 the device 120 displays a first graphic in a display of the mobile computing device 120 and plays a first sound in a sound emitter of the mobile computing device 120. The first graphic and the first sound indicate that the above-surface current geographical location of device 120 is not located within the two dimensional area. For example, the first graphic may be a graphic of alphanumeric text that reads "NOT IN THE BUFFER ZONE" or "NOT NEAR THE TARGET" or the like. Alternatively, the first graphic may comprise a specific computer icon, a circle with a horizontal line through it, a null sign or another graphic that indicates zero, or a negative. In another example, the first sound comprises an alarm or other alerting sound, such as high pitch beeping. In yet another example, the first sound comprises a recording of a person stating "NOT IN THE BUFFER ZONE" or "NOT NEAR THE TARGET" or the like. Accordingly, FIG. 5B shows that when array 112 is not located in the buffer zone 550, the device 120 displays a first graphic and plays a first sound.

In one alternative, if the current geographical location of device 120/array 112 is not located within the buffer zone 550, then in step 312 the device 120 may also display a first graphic in the display, wherein the first graphic is an arrow that points towards the target buried asset or towards the buffer zone of the target buried asset. See a more detailed description below with reference to FIG. 4H.

In another alternative, if the current geographical location of device 120/array 112 is not located within the buffer zone 550, then in step 312 the device 120 initiates a first vibration in a vibration device of the mobile computing device 120. This acts as an additional notice to the user that the device is not located in the buffer zone.

In the embodiment where server 102 determines whether the current geographical location of the device 120/array 112 is located within the buffer zone 550, step 312 comprises the server 102 transmitting a message to device 120, via network 106, wherein the message includes a command that device 120 display the first graphic in a display of the mobile computing device 120 and play the first sound in a sound emitter of the mobile computing device 120. Upon receiving said message, the device 120 reads said command and proceeds to display the first graphic and play the first sound.

If the current geographical location of device 120/array 112 is located within the buffer zone 550, then in step 314 the device 120 displays a second graphic in a display of the mobile computing device 120 and plays a second sound in a sound emitter of the mobile computing device 120. The second graphic and the second sound indicate that the above-surface current geographical location of device 120 is positively located within the two dimensional area. For example, the second graphic may be a graphic of alphanumeric text that reads "YOU ARE IN THE BUFFER ZONE" or "YOU ARE NEAR THE TARGET" or the like. Alternatively, the second graphic may comprise a specific computer icon, an exclamation point, a happy face, or another graphic that indicates a positive. In another example, the second sound comprises a calming or upbeat sound, such as a few musical notes. In yet another example, the second sound comprises a recording of a person stating "YOU ARE IN THE BUFFER ZONE" or "YOU ARE NEAR THE TARGET" or the like. Accordingly, FIG. 5B shows that when array 112 is located in the buffer zone 550, the device 120 displays a second graphic and plays a second sound.

In another alternative, if the current geographical location of device 120/array 112 is located within the buffer zone 550, then in step 314 the device 120 initiates a second vibration (different form the first vibration) in the vibration device of the mobile computing device 120. This acts as an additional notice to the user that the device is located in the buffer zone.

In the embodiment where server 102 determines whether the current geographical location of the device 120/array 112 is located within the buffer zone 550, step 312 comprises the server 102 transmitting a message to device 120, via network 106, wherein the message includes a command that device 120 display the second graphic in a display of the mobile computing device 120 and play the second sound in a sound emitter of the mobile computing device 120. Upon receiving said message, the device 120 reads said command and proceeds to display the second graphic and play the second sound.

Hence, the technician is notified when the array 112 is above the incorrect buried asset 551, and therefore he can avoid a mis-identification of target buried asset 552, i.e., the technician cannot mistake buried asset 551 with the target buried asset 552 under the ground 518.

In step 320, the device 120 utilizes the antenna array 112 to read raw analog signals 520 emanating from the target buried asset 552. Based on the data it has received and calculated, device 120 calculates one or more buried asset data points 204 for the target buried asset 552. The device 120 uploads the buried asset data points 206 to the server 102 via the network 106.

In one alternative to steps 309, 312 and 314, if in step 309 the device 120 determines that the device 120/array 112 is not located within the buffer zone 550, the device 120 determines whether the location function of array 112 is enabled, and if so, in step 312 the locating function of array 112 is disabled. FIG. 5B shows that when array 112 is not located in the buffer zone 550, the locating function is turned off. If in step 309 the device 120 determines that the device 120/array 112 is in fact located within the buffer zone 550, the device 120 determines whether the location function of array 112 is disabled, and if so, in step 314 the locating function of array 112 is enabled. FIG. 5B shows that when array 112 is in fact located within the buffer zone 550, the locating function is turned on. Hence, the locating functions of array 112 are not turned on when the array is above the incorrect buried asset 551, and therefore the technician can avoid mis-identifying the target buried asset 552.

As described above, the locating functions of array 112 may be enabled or disabled at various times. In one embodiment, the term "locating functions" or "electromagnetic locating functions" shall refer to those functions of the array 112 (or any conventional locator device) that performs electromagnetic signal sensing or detecting functions for the purpose of detecting and marking buried assets. In another embodiment, the locating functions of array 112, however, may include a bundle of various different sensing and measurement activities or functions. For example, the detecting and, separately, measuring of each of the individual data values for a buried asset data point (as described above, including current time, geographical coordinate, electromagnetic signal measurement. etc.) may comprise a separate function that may be turned on and off separately. Note that a function for measuring a metric (such as magnetic field) may be a completely separate and distinct function from one that detects or senses the presence of a magnetic field.

In one embodiment, the enablement/disablement of the locating functions of array 112 may comprise enabling or disabling only a portion of the different sensing activities or functions of array 112. For example, in alternative step 312, the electromagnetic signal detecting function may be disabled but the depth measurement function may be enabled. In another embodiment, the method 300 checks for depth measurement functions and enables and disables it accordingly. In this embodiment, it is determined whether the depth measurement functions of the component are enabled, and if so, in alternative step 312, the depth measurement function is disabled (while other functions, like electromagnetic signal detection functions, remain in place). Also in this embodiment, in alternative step 314, it is determined whether the depth measurement functions of the component are disabled, and if so, in alternative step 316, the depth measurement function is enabled.

It should be noted that although the description above denotes that certain steps, calculations or functions are performed specifically by device 120 or device 112, said steps, calculations or functions may be performed by either device 120 or device 112, or another device that combines the functions of device 120 and device 112.

Figure 4A:
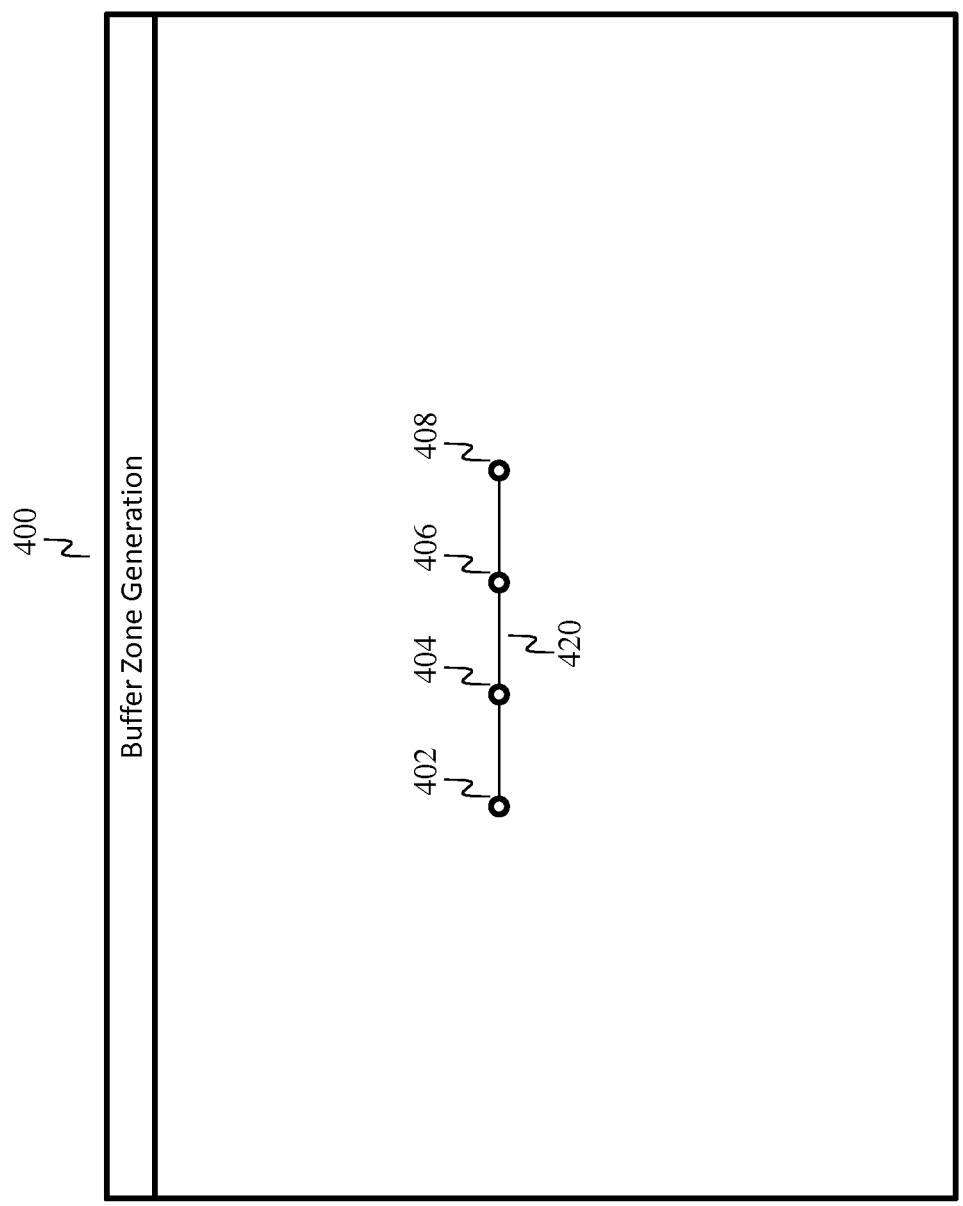
FIGS. 4A through 4G depict illustrations of graphical user interfaces that show how buffer zones are created based on buried asset data points, according to an example embodiment.
Figure 4B:
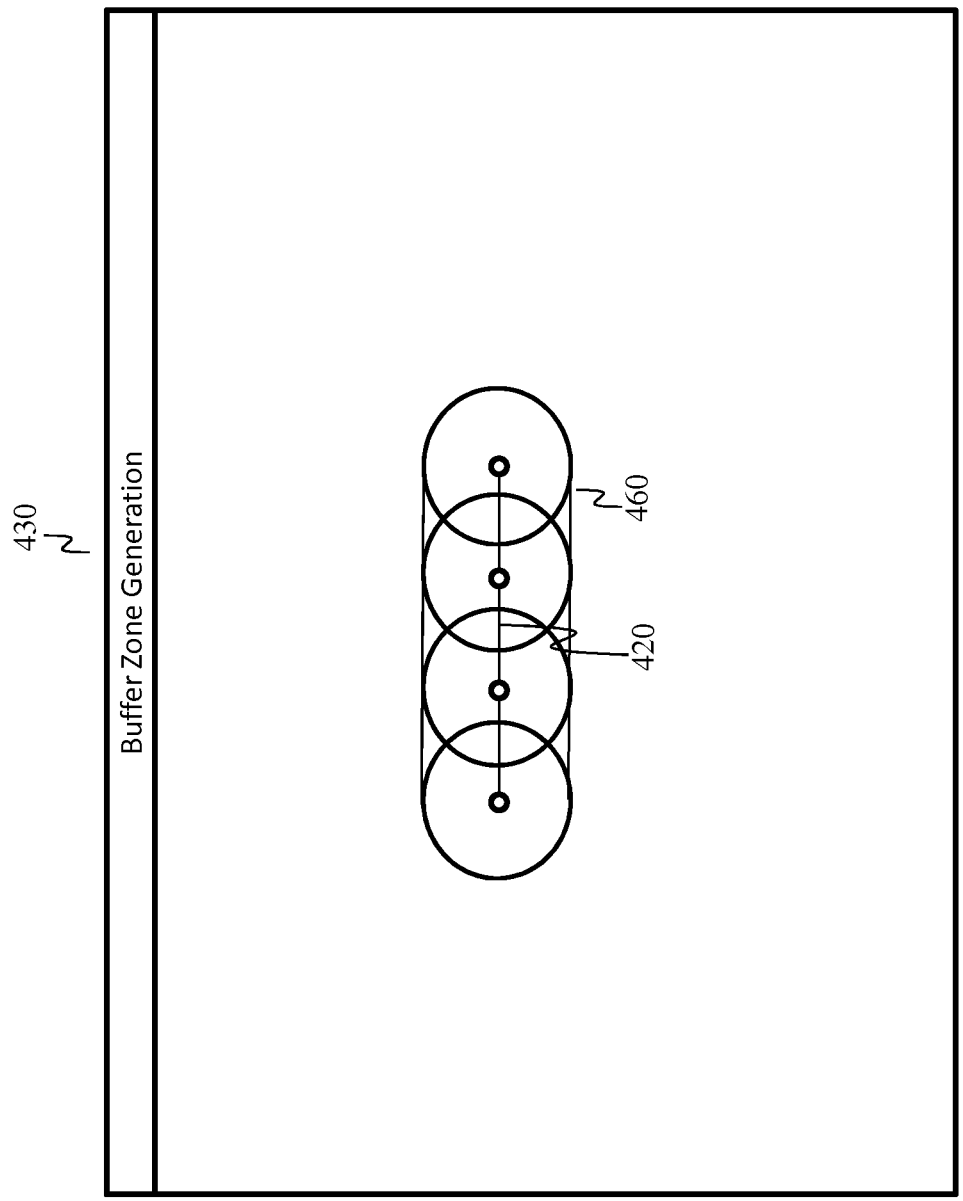
Figure 4C:
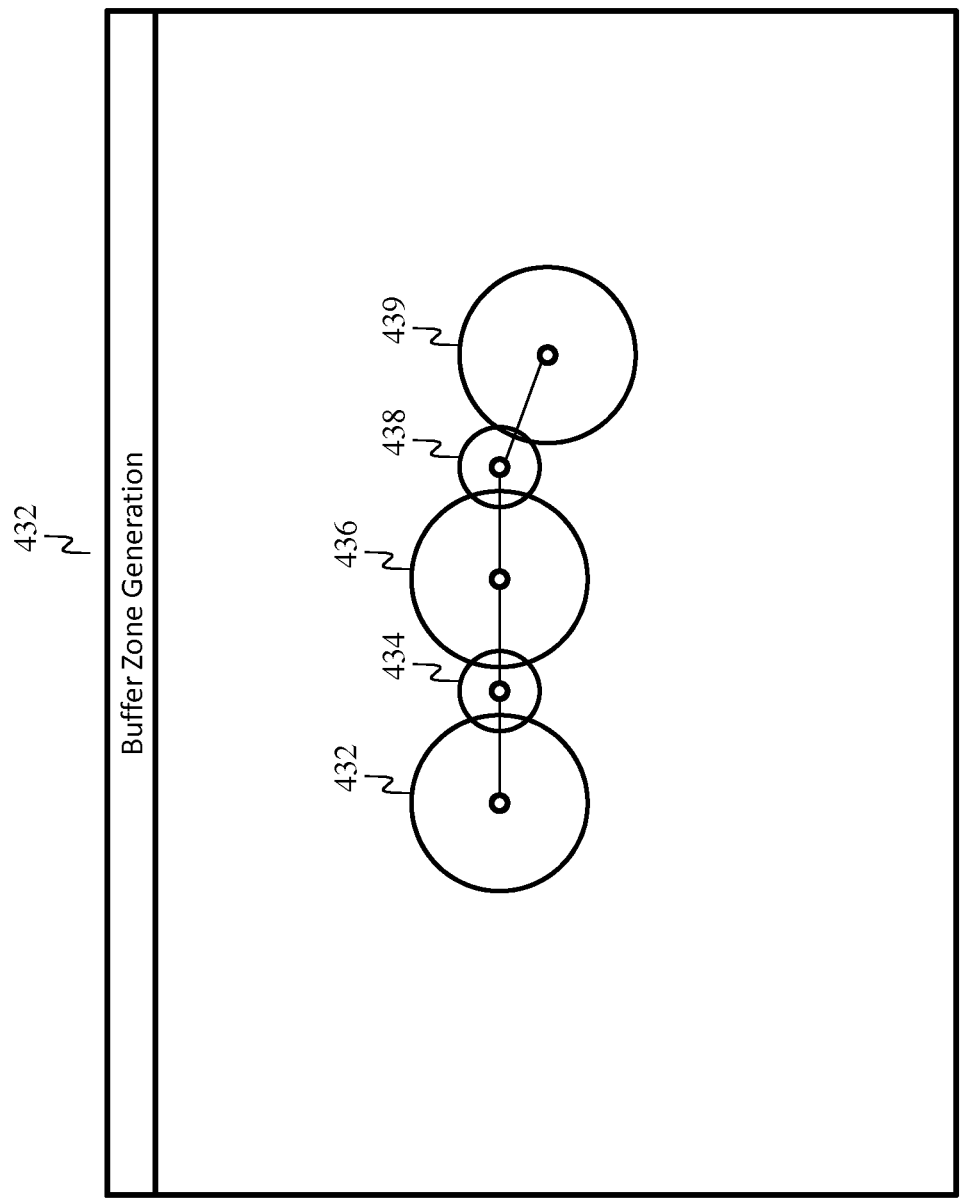
Figure 4D:
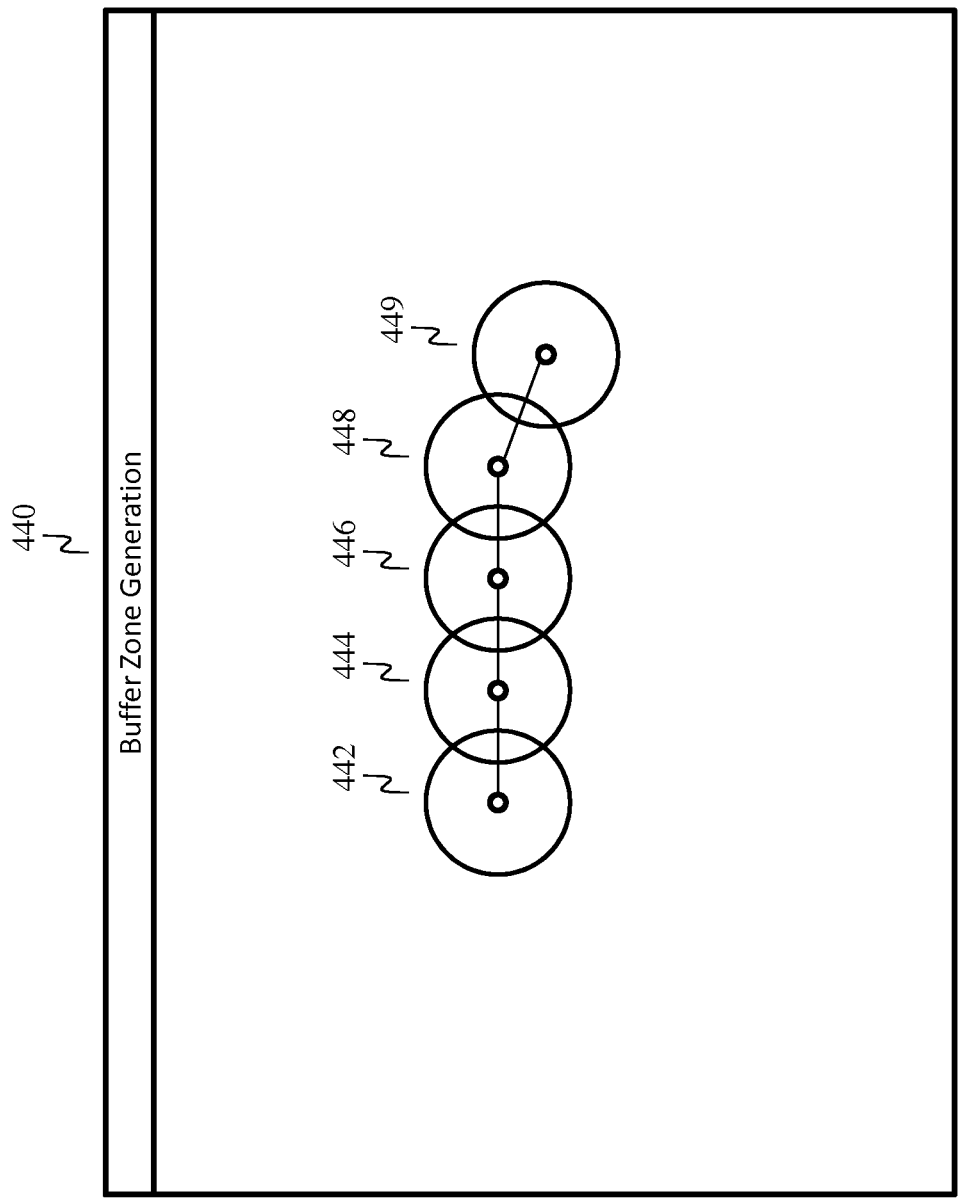
Figure 4E:
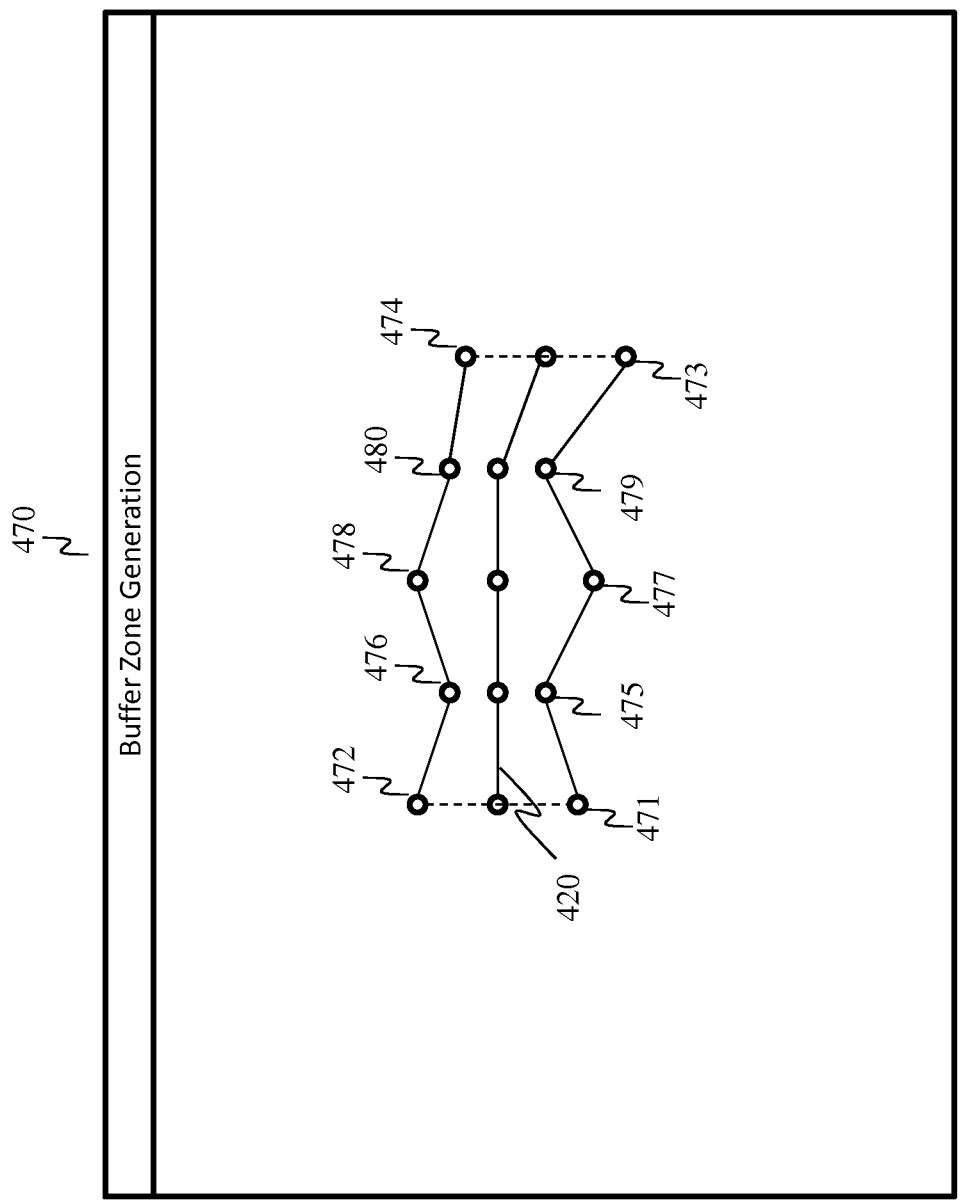
Figure 4F:
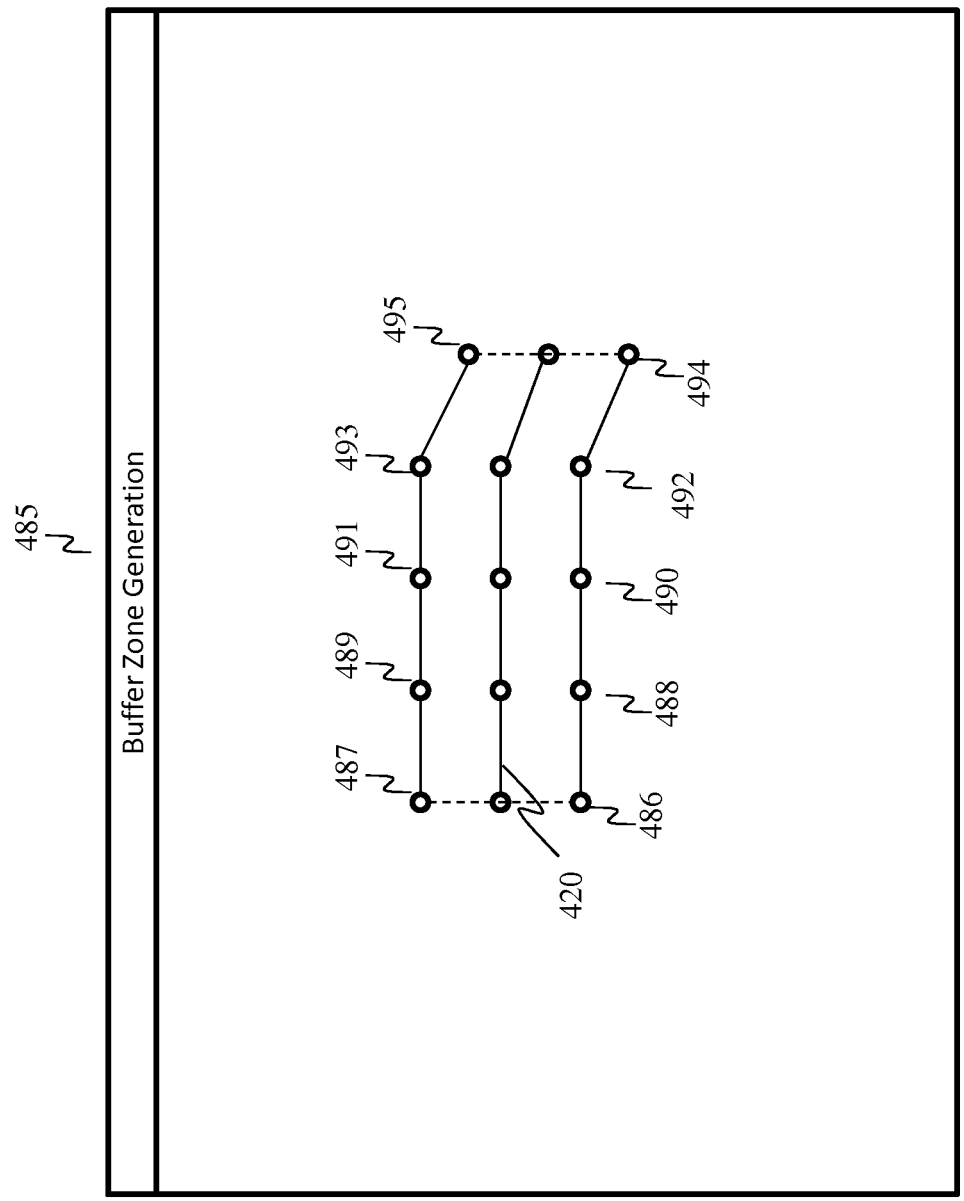
Figure 4G:
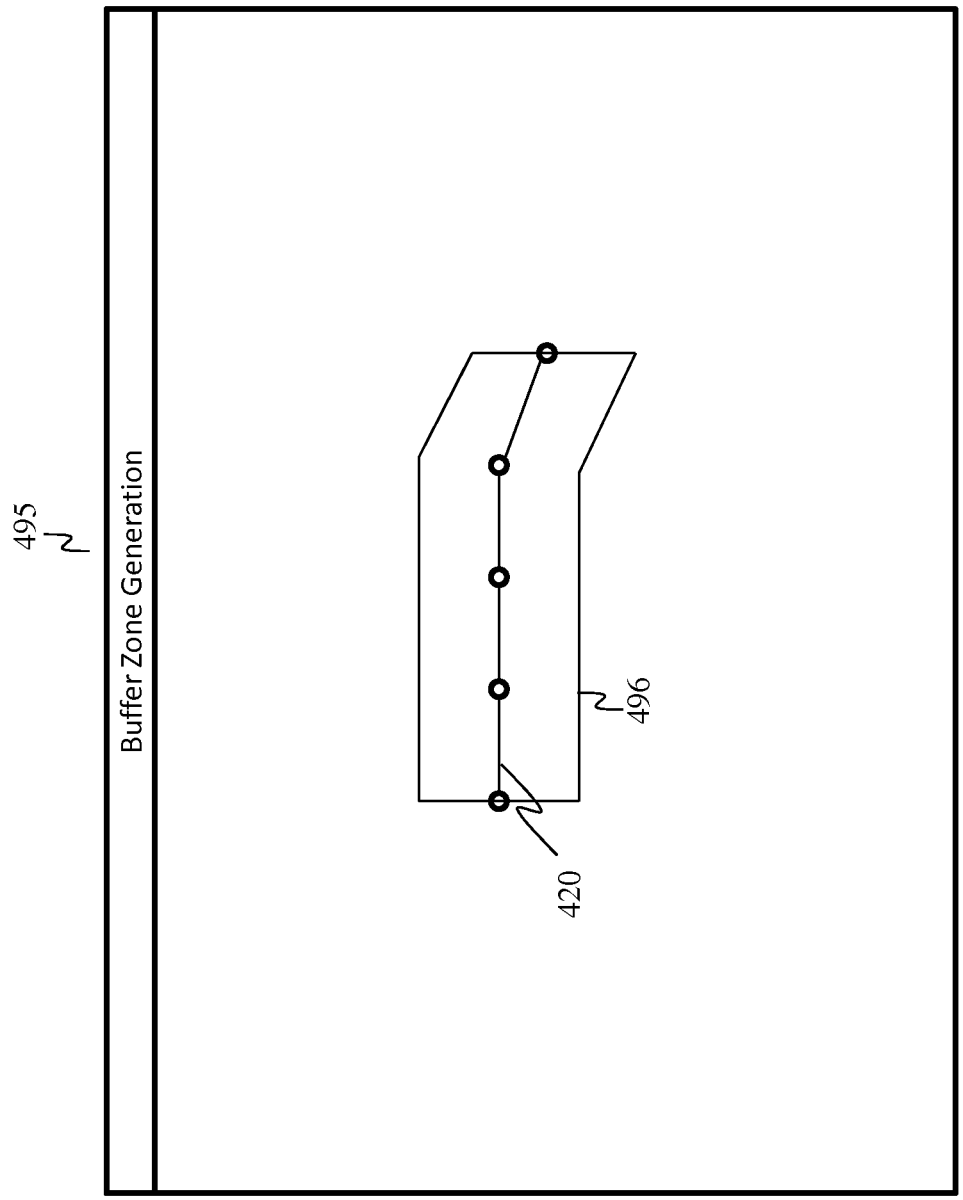
Figure 4H:
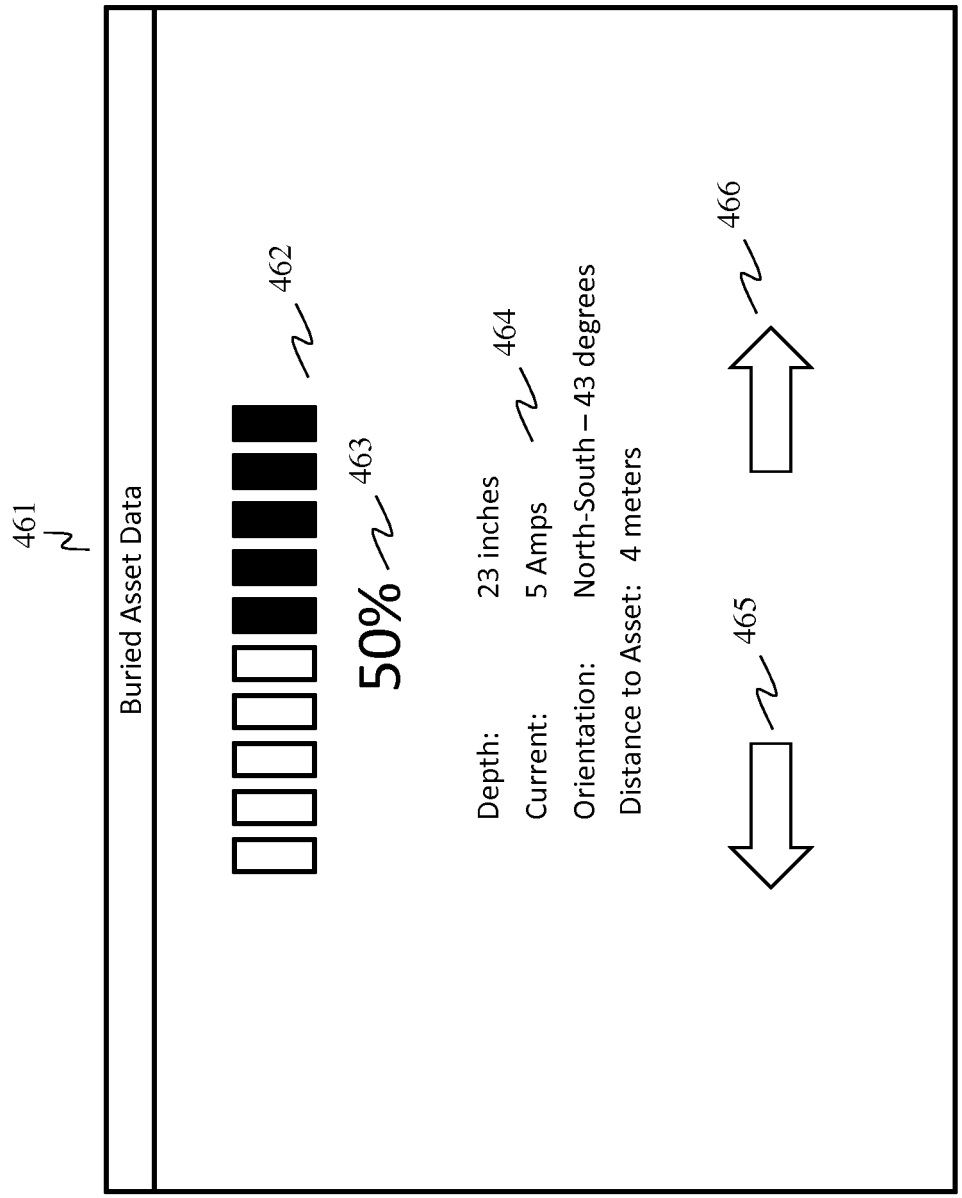
FIG. 4H is an illustration of a graphical user interface that displays data associated with locating a buried asset, according to an example embodiment.

FIG. 4H is an illustration of a graphical user interface that displays data associated with locating a buried asset, according to an example embodiment. The graphical user interface 461 may be viewed on device 120 of array 112 or both. The interface 461 may display buried asset data 464. Recall that buried asset data may include depth, position, electrical signal measurement (such as current, resistance, impedance, magnitude, frequency, voltage, etc.), direction and orientation. Interface 461 may also include a graphic 462 that indicates the signal strength of the buried asset being detected (such as a meter reading comprising ten bars), and a numerical indicator 463 that indicates the signal strength of the buried asset being detected. In one embodiment, the device receives human readable buried asset data and based on the data received, the device calculates the appropriate graphic 462 or numerical indicator 463 to display in interface 461. For example, if a device receives human readable buried asset data indicating 50% signal strength, the device calculates the appropriate graphic 463 to display in interface 461 is five out of ten bars, which graphically indicates 50%. Lastly, the interface 461 may also include left and right arrows 465, 466, which points the technician in the direction of the location of the buffer zone of the target buried asset being sought. Left and right arrows 465, 466, may additionally indicate to the technician the direction in which the system or device should be moved in order to read increased signal strength from of the buried asset being detected. In another embodiment, left and right arrows 465, 466, may additionally indicate to the technician the distance from the system or device to the target buried asset. In this embodiment, the distance data is provided in units of measurement, such as feet or meters, and said data is included in the data cluster 464.

FIGS. 4A through 4B depict illustrations of graphical user interfaces (GUI) that show how a buffer zone is generated by device 120 using buried asset data points received from server 102, according to an example embodiment. See parent patent application Ser. Nos. 14/519,910, 14/226,397, and 14/060,301 for additional disclosure of how buffer zones are generated. In FIG. 4A, the GUI 400 shows that four buried asset data points 402, 404, 406, 408 are displayed according to their corresponding geographical coordinate data. The buried asset data points 402, 404, 406, 408 are connected via straight line segments to form a central line 420 that represents an approximation of the location of the buried asset in between the buried asset data points 402, 404, 406, 408.

GUI 430 of FIG. 4B shows that a two-dimensional area 460 comprising a buffer zone has been created around the buried asset data points 402, 404, 406, and 408. In GUI 430, the two-dimensional area was generated by defining a two-dimensional circle around each buried asset data point, wherein each circle is perpendicular to the central line 420, and connecting the tops of each circle, so as to create a two-dimensional area 460 that surrounds the central line 420. As discussed in more detail in said parent patent applications, different types of buffer zones may be generated, such as three dimensional buffer zones comprising a volume, and the size and shape of buffer zones may vary according to the precision data values associated with the geographical location data (or any other data collected about a buried asset data point, such as depth measurement data) of each buried asset data point 402, 404, 406, and 408. Specifically, the size and shape of each circle or sphere surrounding a buried asset data point may vary according to the precision data value associated with the geographical location data associated with each buried asset data point 402, 404, 406, and 408 (or may vary according to a precision data value of any other data associated with a buried asset data point, such as depth measurement value, electromagnetic measurement data value, etc.). In another embodiment, the size and shape of each circle or sphere surrounding a buried asset data point corresponds to a predefined value that is stored in memory.

In one embodiment, in GUI 430 depicts a two-dimensional surface (comprising the buffer zone) that is generated around the buried asset data points is generated as follows: 1) define the central line 420, as defined above, 2) read the precision data values of all or a portion of the geographical coordinates of the buried asset data points in GUI 430, and calculate an average value thereof, 3) generate a radius value that corresponds to the average value (such as by multiplying the average value by a constant that represents the desired size of the buffer), 4) for each buried asset data point, generate a two-dimensional circle with a radius equal to the radius value, using the buried asset data point as the center, and wherein the circle is perpendicular to the central line, 5) join all circles so as to define the two-dimensional surface comprising the buffer zone that surrounds the central line 420.

With regard to FIG. 4C, GUI 432 shows that a circular two-dimensional area comprising a buffer zone has been created around each buried asset data point, wherein the union of all of the circular two-dimensional areas comprises the buffer zone around the buried asset data points. The size of each circular two-dimensional area corresponds to the precision data value corresponding to the geographical coordinate of the buried asset data point. In one embodiment, the circular two-dimensional area generated around each buried asset data point is generated as follows: 1) read the precision data value of the geographical coordinate of the buried asset data point, 2) generate a radius value that corresponds to the precision data value (such as by multiplying the precision data value by a constant that represents the desired size of the buffer), 3) create a circle around the buried asset data point using the radius value as the radius measurement of the circle.

In one embodiment, the size of the circle created around a buried asset data point is larger when the precision data value reflects low precision and the circle is smaller when it reflects high precision. Thus, when the geographical coordinate of the buried asset data point has low precision (according to the precision data value), then the circular two-dimensional area is larger. When the geographical coordinate of the buried asset data point has high precision (according to the precision data value), then the circular two-dimensional area is smaller. Consequently, the circular areas 432, 436 and 439 are large because the geographical coordinates of the corresponding buried asset data points have low precision. Further, the circular areas 434, 438 are small because the geographical coordinates of the corresponding buried asset data points 404, 408 have high precision.

With regard to FIG. 4D, GUI 440 shows that a circular two-dimensional area of uniform size has been created around each buried asset data point, wherein the union of all of the circular two-dimensional areas comprises the buffer zone around the buried asset data points. In GUI 440, the precision data values corresponding to the geographical coordinates of the buried asset data points have been averaged and used to generate the circular two-dimensional areas 442, 444, 446, 448, 449. In one embodiment, the circular two-dimensional area generated around each buried asset data point is generated as follows: 1) read the precision data values of the geographical coordinates of all, or a portion of, the buried asset data points, 2) average the precision data values, 3) generate a radius value that corresponds to the average precision data value (such as by multiplying the average value by a constant that represents the desired size of the buffer), 4) create a circle around each buried asset data point using the radius value as the radius measurement of each circle. In one alternative embodiment, a predefined radius or diameter value is used to generate the circular two-dimensional areas 442, 444, 446, 448, 449.

With regard to FIG. 4E, GUI 470 shows that a two-dimensional area comprising a buffer zone has been created around the buried asset data points. The two-dimensional area was generated by defining buffer points on either side of each buried asset data point so as to create a corridor-type area that surrounds the central line 420. Namely, a pair of buffer points has been defined on either side of each buried asset data point, i.e., a point to the left and a point to the right. The distance of the pair of buffer points from the buried asset data point corresponds to the precision data value corresponding to the geographical coordinate of the buried asset data point. Once the pair of buffer points has been defined for each buried asset data point, the buffer points to the right of the central line 420 are connected via line segments, and the buffer points to the left of the central line 420 are connected via line segments, so as to generally define a two-dimensional area comprising the buffer zone that surrounds the central line 420. Note also that the ends of the corridor are closed by joining the first buffer point 471 to the right of the central line with the first buffer point 472 to the left of the central line, and by joining the last buffer point 473 to the right of the central line with the last buffer point 474 to the left of the central line.

In one embodiment, the two-dimensional area (comprising the buffer zone) generated around the buried asset data points is generated as follows: 1) define the central line 420, as defined above, 2) read the precision data value of the geographical coordinate of the first buried asset data point, 3) generate a radius value that corresponds to the precision data value (such as by multiplying the precision data value by a constant that represents the desired size of the buffer), 4) generate a buffer point having a distance equal to the radius value from the first buried asset data point but also being on a line perpendicular to, and located to one—e.g., the right—side of the central line, 5) generate a buffer point having a distance equal to the radius value from the first buried asset data point but also being on a line perpendicular to, and located to the other—e.g., the left—side of the central line, 6) repeat steps 2 through 6 for all remaining buried asset data points, 7) join all buffer points on one—e.g., the right—side of the central line using straight line segments, 8) join all buffer points on the other—e.g., the left—side of the central line using straight line segments, 9) join the first buffer point on one—e.g., the right—side of the central line with the first buffer point on the other—e.g., the left—side of the central line, 10) join the last buffer point on one—e.g., the right—side of the central line with the last buffer point on the other—e.g., the left—side of the central line.

Again, in GUI 470, the distance of a buffer point from a buried asset data point is larger when the precision data value of that buried asset data point reflects low precision and the distance is smaller when it reflects high precision. Consequently, the pairs 471/471, 477/478 and 473/474 are farther from the corresponding buried asset data point because the geographical coordinates of the corresponding buried asset data points have low precision. Further, the pairs 475/476 and 479/480 are closer to the corresponding buried asset data points because the geographical coordinates of the corresponding buried asset data points have high precision.

With regard to FIG. 4F, GUI 485 shows that another two-dimensional area comprising a buffer zone has been created around the buried asset data points. Like GUI 470, the two-dimensional area in GUI 485 was generated by defining buffer points on either side of each buried asset data point so as to create a corridor-type area that surrounds the central line 420. But in GUI 485, the distance of the pair of buffer points from the buried asset data point corresponds to the average of all or a portion of all precision data values corresponding to the geographical coordinates of the buried asset data points shown in GUI 485. Alternatively, the distance of the pair of buffer points from the buried asset data point corresponds to a predefined value that is set and stored beforehand in device 120. Once the pair of buffer points has been defined for each buried asset data point, the buffer points to the right of the central line 420 are connected via line segments, and the buffer points to the left of the central line 420 are connected via line segments, so as to generally define a two-dimensional area comprising the buffer zone that surrounds the central line 420. Note also that the ends of the corridor are closed by joining the first buffer point 486 to the right of the central line with the first buffer point 487 to the left of the central line, and by joining the last buffer point 494 to the right of the central line with the last buffer point 495 to the left of the central line.

In one embodiment, in GUI 485 the two-dimensional area (comprising the buffer zone) generated around the buried asset data points is generated as follows: 1) define the central line 420, as defined above, 2) read the precision data values of all or a portion of the geographical coordinates of the buried asset data points in GUI 485, and calculate an average value thereof, 3) generate a radius value that corresponds to the average value (such as by multiplying the average value by a constant that represents the desired size of the buffer), or, alternatively, read a predefined value from storage, 4) for each buried asset data point, generate a buffer point having a distance equal to the average value (or to the predefined value) from the first buried asset data point but also being on a line perpendicular to, and located to one—e.g., the right—side of the central line, 5) for each buried asset data point, generate a buffer point having a distance equal to the average value (or the predefined value) from the first buried asset data point but also being on a line perpendicular to, and located to the other—e.g., the left—side of the central line, 6) join all buffer points on one—e.g., the right—side of the central line using straight line segments, 7) join all buffer points on the other—e.g., the left—side of the central line using straight line segments, 8) join the first buffer point on one—e.g., the right—side of the central line with the first buffer point on the other—e.g., the left—side of the central line, 9) join the last buffer point on one—e.g., the right—side of the central line with the last buffer point on the other—e.g., the left—side of the central line.

Again, in GUI 485, the distance of a buffer point from a buried asset data point is larger when the average precision data value of the buried asset data points reflects low precision and the distance is smaller when it reflects high precision. Alternatively, the distance of a buffer point from a buried asset data point is constant for all buried asset data points when a predefined value is used to create the buffer zone.

With regard to FIG. 4G, GUI 495 shows that another two-dimensional area comprising a buffer zone has been created around the buried asset data points. Like GUI 485, the two-dimensional area in GUI 495 was generated by defining an area on either side of each buried asset data point so as to create a corridor-type area 496 that surrounds the central line 420. But in GUI 495, the width of the corridor-type area 496 corresponds to a predefined value that is set and stored beforehand in device 120. Once the predefined value has been read, an area around the central line 420 (i.e., an area to the left and right) is defined proportionally to the predefined value, so as to generally define a two-dimensional area comprising the buffer zone that surrounds the central line 420. Note that the predefined value may be a value that corresponds to the width or half of the width of the corridor-type area 496.

In one embodiment, in GUI 495 the two-dimensional area 496 (comprising the buffer zone) generated around the buried asset data points is generated as follows: 1) define the central line 420, as defined above, 2) read the predefined value, 3) generate a two-dimensional area similar to a corridor that extends on either side of the central line to a distance proportional to the predefined value.

In another embodiment, the process described with reference to FIG. 4G may be modified to create a three-dimensional volume comprising a buffer zone around the buried asset data points. In this embodiment, the three-dimensional volume is generated by defining a tubular surface that surrounds each buried asset data point so as to create a tube-like surface that surrounds the central line 420. The width or radius of the tube or conduit-like surface corresponds to the predefined value that is set and stored beforehand in device 120. Once the predefined value has been defined, a tubular surface around the central line 420 is defined, so as to generally define a three-dimensional volume comprising the buffer zone that surrounds the central line 420. Note that the predefined value may be a value that corresponds to the width or radius of the tube-like surface defining a three-dimensional volume.

Figure 6:
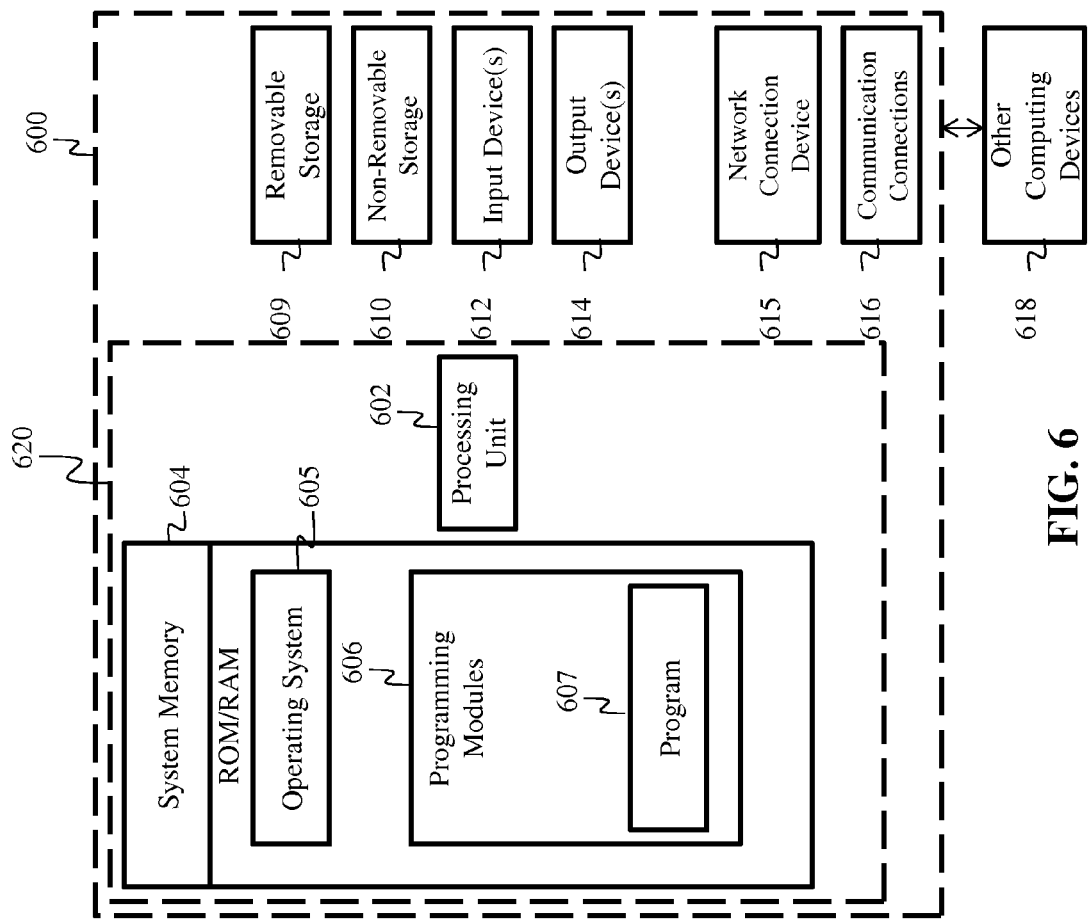
FIG. 6 is a block diagram of a system including a computing device, according to an example embodiment.

FIG. 6 is a block diagram of a system including an example computing device 600 and other computing devices. Consistent with the embodiments described herein, the aforementioned actions performed by server 102, device 120, and antenna array 112 may be implemented in a computing device, such as the computing device 600 of FIG. 6. Any suitable combination of hardware, software, or firmware may be used to implement the computing device 600. The aforementioned system, device, and processors are examples and other systems, devices, and processors may comprise the aforementioned computing device. Furthermore, computing device 600 may comprise an operating environment for system 100 and process 300, as described above. Process 300 may operate in other environments and are not limited to computing device 600.

With reference to FIG. 6, a system consistent with an embodiment of the invention may include a plurality of computing devices, such as computing device 600. In a basic configuration, computing device 600 may include at least one processing unit 602 and a system memory 604. Depending on the configuration and type of computing device, system memory 604 may comprise, but is not limited to, volatile (e.g. random access memory (RAM)), non-volatile (e.g. read-only memory (ROM)), flash memory, or any combination or memory. System memory 604 may include operating system 605, and one or more programming modules 606. Operating system 605, for example, may be suitable for controlling computing device 600's operation. In one embodiment, programming modules 606 may include, for example, a program module 607 for executing the actions of server 102, and device 120. Furthermore, embodiments of the invention may be practiced in conjunction with a graphics library, other operating systems, or any other application program and is not limited to any particular application or system. This basic configuration is illustrated in FIG. 6 by those components within a dashed line 620.

Computing device 600 may have additional features or functionality. For example, computing device 600 may also include additional data storage devices (removable and/or non-removable) such as, for example, magnetic disks, optical disks, or tape. Such additional storage is illustrated in FIG. 6 by a removable storage 609 and a non-removable storage 610. Computer storage media may include volatile and nonvolatile, removable and non-removable media implemented in any method or technology for storage of information, such as computer readable instructions, data structures, program modules, or other data. System memory 604, removable storage 609, and non-removable storage 610 are all computer storage media examples (i.e. memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 600. Any such computer storage media may be part of device 600. Computing device 600 may also have input device(s) 612 such as a keyboard, a mouse, a pen, a sound input device, a camera, a touch input device, etc. Output device(s) 614 such as a display, speakers, a printer, etc. may also be included. Computing device 600 may also include a vibration device capable of initiating a vibration in the device on command, such as a mechanical vibrator or a vibrating alert motor. The aforementioned devices are only examples, and other devices may be added or substituted.

Computing device 600 may also contain a network connection device 615 that may allow device 600 to communicate with other computing devices 618, such as over a network in a distributed computing environment, for example, an intranet or the Internet. Device 615 may be a wired or wireless network interface controller, a network interface card, a network interface device, a network adapter or a LAN adapter. Device 615 allows for a communication connection 616 for communicating with other computing devices 618. Communication connection 616 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both computer storage media and communication media.

As stated above, a number of program modules and data files may be stored in system memory 604, including operating system 605. While executing on processing unit 602, programming modules 606 (e.g. program module 607) may perform processes including, for example, one or more of the stages of the processes 200, 300 as described above. The aforementioned processes are examples, and processing unit 602 may perform other processes. Other programming modules that may be used in accordance with embodiments of the present invention may include electronic mail and contacts applications, word processing applications, spreadsheet applications, database applications, slide presentation applications, drawing or computer-aided application programs, etc.

Generally, consistent with embodiments of the invention, program modules may include routines, programs, components, data structures, and other types of structures that may perform particular tasks or that may implement particular abstract data types. Moreover, embodiments of the invention may be practiced with other computer system configurations, including hand-held devices, multiprocessor systems, microprocessor-based or programmable consumer electronics, minicomputers, mainframe computers, and the like. Embodiments of the invention may also be practiced in distributed computing environments where tasks are performed by remote processing devices that are linked through a communications network. In a distributed computing environment, program modules may be located in both local and remote memory storage devices.

Furthermore, embodiments of the invention may be practiced in an electrical circuit comprising discrete electronic elements, packaged or integrated electronic chips containing logic gates, a circuit utilizing a microprocessor, or on a single chip (such as a System on Chip) containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general purpose computer or in any other circuits or systems.

Embodiments of the present invention, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the invention have been described, other embodiments may exist. Furthermore, although embodiments of the present invention have been described as being associated with data stored in memory and other storage mediums, data can also be stored on or read from other types of computer-readable media, such as secondary storage devices, like hard disks, floppy disks, or a CD-ROM, or other forms of RAM or ROM. Further, the disclosed methods' stages may be modified in any manner, including by reordering stages and/or inserting or deleting stages, without departing from the invention.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method on a mobile computing device for locating electromagnetic signals radiating from a buried asset, the method comprising:
    receiving, via a communications network communicatively coupled with the mobile computing device, a group of buried asset data points corresponding to a particular buried asset sought by an operator of the mobile computing device;
    reading a predefined value pertaining to a width of a buffer zone;
    generating, based on the group of buried asset data points, a two dimensional area comprising the buffer zone at an above-surface location, wherein a width of the buffer zone corresponds to the predefined value, and wherein the buffer zone corresponds to the particular buried asset;
    iteratively executing the following four steps:
    a) calculating an above-surface location of the mobile computing device using spatial processes;
    b) determining whether the above-surface location of the mobile computing device is located within the two dimensional area;
    c) if the above-surface location is not located within the two dimensional area, displaying a first graphic in a display of the mobile computing device; and
    d) if the above-surface location is located within the two dimensional area, displaying a second graphic in the display.

2. The method of claim 1, further comprising a step, before the first step of receiving a group of buried asset data points, comprising:
    transmitting, via the communications network communicatively coupled with the mobile computing device, a unique identifier for the particular buried asset sought by the operator of the mobile computing device.

3. The method of claim 2, wherein the step of reading a predefined value further comprises:
    receiving, via the communications network communicatively coupled with the mobile computing device, a predefined value.

4. The method of claim 3, wherein the step of calculating an above-surface location of the mobile device further comprises:
    executing a satellite navigation function on the mobile computing device to calculate the above-surface location of the mobile computing device.

5. The method of claim 4, wherein the step of displaying a first graphic in a display of the mobile computing device further comprises:
    displaying the first graphic in the display of the mobile computing device and playing a first sound in a sound emitter of the mobile computing device, wherein the first graphic and the first sound indicate that the above-surface location is not located within the two dimensional area.

6. The method of claim 4, wherein the step of displaying a first graphic in a display of the mobile computing device further comprises:
    displaying the first graphic in the display of the mobile computing device, wherein the first graphic comprises an indicator that indicates a direction of a location of the two dimensional area.

7. The method of claim 5, wherein the step of displaying a second graphic in the display further comprises:
    displaying the second graphic in the display and playing a second sound in the sound emitter, wherein the second graphic and the second sound indicate that the above-surface location is located within the two dimensional area.

* * * * *